United States Patent
Wang et al.

(10) Patent No.: US 7,262,137 B2
(45) Date of Patent: Aug. 28, 2007

(54) DRY ETCHING PROCESS FOR COMPOUND SEMICONDUCTORS

(75) Inventors: Jennifer Wang, Redondo Beach, CA (US); Huai-Min Sheng, Cerritos, CA (US); Mike Barsky, Sherman Oaks, CA (US)

(73) Assignee: Northrop Grumman Corporation, Los Angeles, CA (US)

( * ) Notice: Subject to any disclaimer, the term of this patent is extended or adjusted under 35 U.S.C. 154(b) by 321 days.

(21) Appl. No.: 10/782,723

(22) Filed: Feb. 18, 2004

(65) Prior Publication Data

US 2005/0181616 A1    Aug. 18, 2005

(51) Int. Cl.
*H01L 21/311*   (2006.01)
(52) U.S. Cl. .................... 438/700; 438/718
(58) Field of Classification Search ........... 438/700, 438/706, 710, 714, 715, 718, 719
See application file for complete search history.

(56) References Cited

U.S. PATENT DOCUMENTS

| | | | | |
|---|---|---|---|---|
| 5,779,926 A | * | 7/1998 | Ma et al. ............... | 216/67 |
| 5,942,447 A | * | 8/1999 | Miyakuni .............. | 438/740 |
| 5,968,845 A | * | 10/1999 | Chino et al. ........... | 438/704 |
| 6,579,802 B1 | * | 6/2003 | Pierson et al. ......... | 438/706 |
| 6,635,185 B2 | * | 10/2003 | Demmin et al. ....... | 216/64 |
| 6,649,082 B2 | * | 11/2003 | Hayasaka et al. ..... | 252/79.1 |
| 2001/0025826 A1 | * | 10/2001 | Pierson et al. ......... | 216/55 |
| 2004/0224473 A1 | * | 11/2004 | Chua et al. ............. | 438/313 |

* cited by examiner

*Primary Examiner*—Kin-Chan Chen
(74) *Attorney, Agent, or Firm*—LaRiviere, Grubman & Payne, LLP

(57) ABSTRACT

Accordingly, this invention relates to an dry etching process for semiconductor wafers. More particularly, the present invention discloses a dry etching process including a halogen etchant (24) and a nitrogen gas (28) that selectively etches a compound semiconductor material (18) faster than the front-side metal layers (16A)(16B). Further, the dry etching process produces a vertical wall profile on compound semiconductor material (18) in both X (38) and Y (40) crystalline directions without undercutting the top of a via-opening.

17 Claims, 5 Drawing Sheets

DRY ETCHING PROCESS FOR COMPOUND SEMICONDUCTORS

TECHNICAL FIELD

This invention relates to a dry etching process for semiconductor wafers. More particularly, the present invention relates to a dry etching process that selectively etches a compound semiconductor wafer faster than the front-side metal layer. Further, the dry etching process produces a vertical wall profile on the compound semiconductor wafer without undercutting the top of an opening.

BACKGROUND ART

Semiconductor wafer processing technologies including Gallium Arsenide (GaAs) and Indium Phosphide (InP) require improvements such as increased etching selectivity for a compound semiconductor wafer compared to a front-side metal layer. For example, as shown in FIG. 1, the thickness varies across a compound semiconductor wafer.

As such, to prevent punch-through of the compound semiconductor wafer to the front-side metal layer, a dry etching process needs to selectively etch the backside of the compound semiconductor wafer. FIG. 1 is an illustration showing a thickness difference across the compound semiconductor wafer. Specifically, FIG. 1 shows a ten micron thickness difference across the compound semiconductor wafer whereby a edge 6 thickness is within the range of approximately 60 μm to approximately 80 μm and a center 8 thickness is within the range of approximately 70 μm to approximately 90 μm. The creation of a via-opening in both edge 6 and center 8 of the compound semiconductor wafer requires complete etching through both center 8 and edge 6 without punching-through the front-side metal layer, i.e., etching wafer front-side metal layers 9A, 9B on a portion of the wafer.

Presently available etching processes are not selective enough to prevent punch-through of the front-side metal layer. As such, there is a need for a dry etching process that selectively etches the backside of the compound semiconductor wafer over the front-side metal layer, thereby preventing the front-side metal layer punch-through, even with compound semiconductor material thickness variations across the wafer, as well as providing other advantages over present etching processes, such as realizing an opening with vertical sidewalls, no undercutting the via-opening, and making a repeatable process.

DISCLOSURE OF THE INVENTION

Accordingly, the present invention provides a dry etching process for a compound semiconductor wafer that prevents front-side metal layer punch through with large thickness variations across the compound semiconductor wafer. Other advantages include that the dry etching process creates an opening with vertical sidewalls in both X and Y crystalline directions and creates no undercutting of the top of the opening. In one embodiment of the present invention, the compound semiconductor wafer comprises a compound semiconductor material. As disclosed, the present invention is a dry etching process for the compound semiconductor material comprising the steps of placing in a chamber the compound semiconductor material having an exposed portion, adding a halogen etchant, adding a nitrogen gas to the chamber, and heating the electrostatic chuck that supports the compound semiconductor material.

Afterwards, applying bias power and a pulse-modulated power to the controlled amount of the gas, whereby the exposed portion of the compound semiconductor material is etched with vertical sidewalls. This process creates within a range of approximately 70 times greater etch rate to approximately 80 times greater etch rate for the compound semiconductor material than the etch rate of the deposited front-side metal layer.

In one embodiment, the halogen etchant is a halogen gas is selected from a group consisting of Chlorine, Fluorine and Bromine. Further, in one alternative embodiment, the halogen etchant comprises a halogen-containing compound selected from the group consisting of Hydrogen Bromide and Hydrogen Iodide.

In the embodiment, the etching process further includes heating, biasing and pulse-modulated powering the halogen etchant and the nitrogen gas within the chamber to complete the etching process. It is an advantage of the present invention that the dry etching process does not damage a non-exposed portion of the compound semiconductor wafer during the etching process. It is an additional advantage of the present invention that the addition of the nitrogen gas to the halogen etchant reduces the etch rate of the front-side metal layer by more than 90 percent.

Additionally, the present invention discloses the dry etchant for compound semiconductor material G and F, wherein G is selected from the group consisting of a halogen gas and a halogen-containing compound, and F is a nitrogen gas, and wherein G and F volume ratio is selected from a range of approximately 10:1 to approximately 12:1. In this embodiment of the present invention, the halogen gas is one selected from the group consisting of Chlorine, Fluorine and Bromine and the halogen-containing compound is one selected from a group consisting of Hydrogen Bromide (HBr) and Hydrogen Iodide (HI).

BRIEF DESCRIPTION OF THE DRAWINGS

For a better understanding of the present invention, reference is made to the below-referenced drawings. Reference numbers refer to the same or equivalent parts of the present invention throughout the several figures of the drawings.

FIG. 3 is an example of the present invention illustrating the FIG. 2B dry etch process of the present invention for a compound semiconductor wafer resulting in no undercutting and no front-side metal layer punch-through.

MODES FOR CARRYING-OUT THE INVENTION

Figure 1:
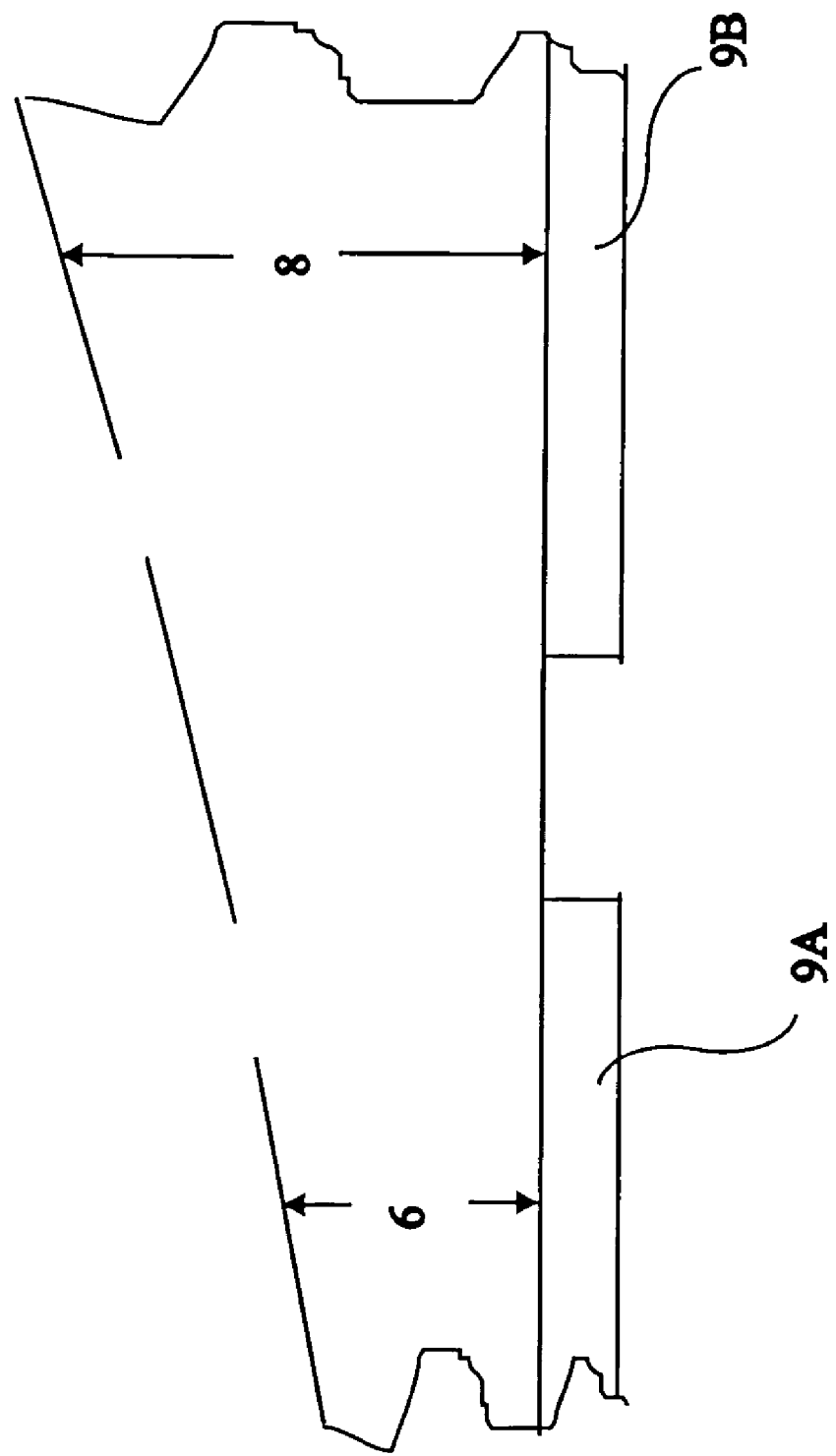
FIG. 1 is a diagram displaying the thickness variation across a compound semiconductor wafer.
Figure 2A:
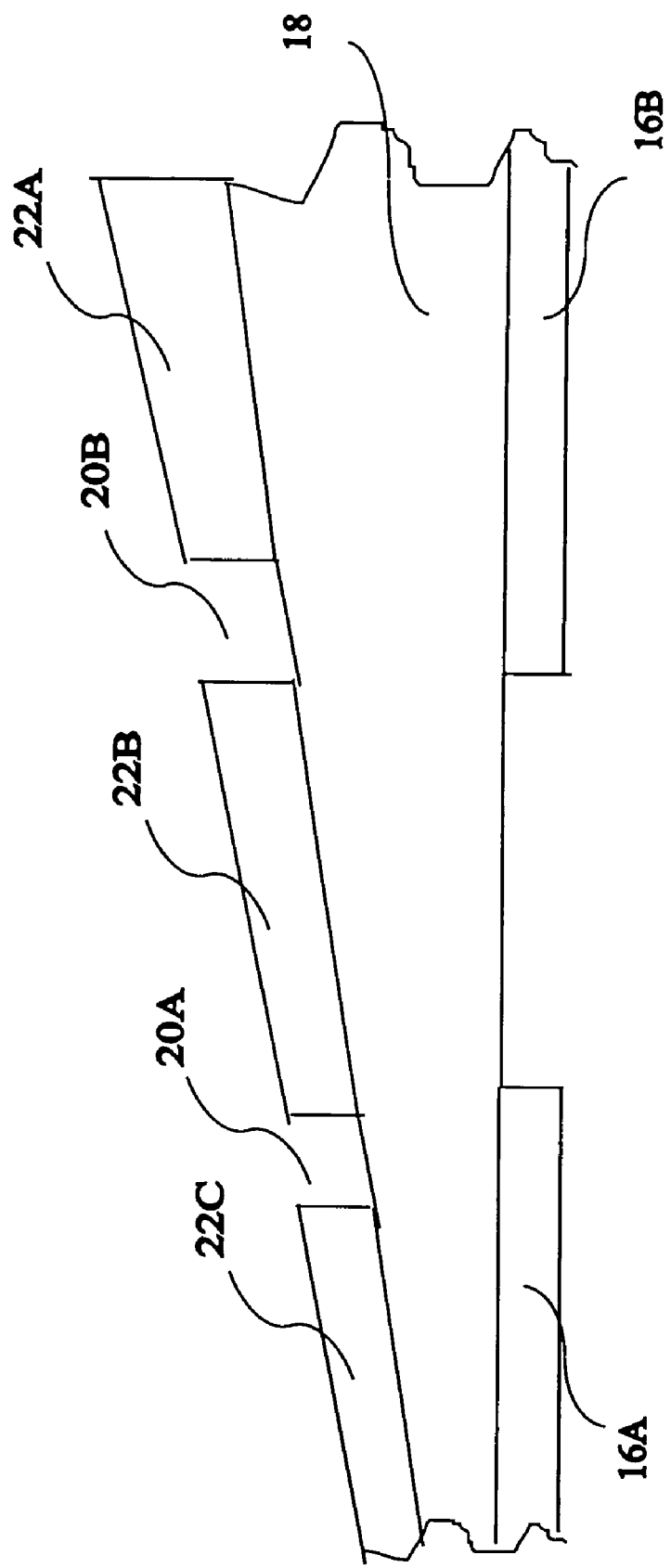
FIG. 2A is a beginning structure for the dry etching process for a compound semiconductor material.
Figure 2B:
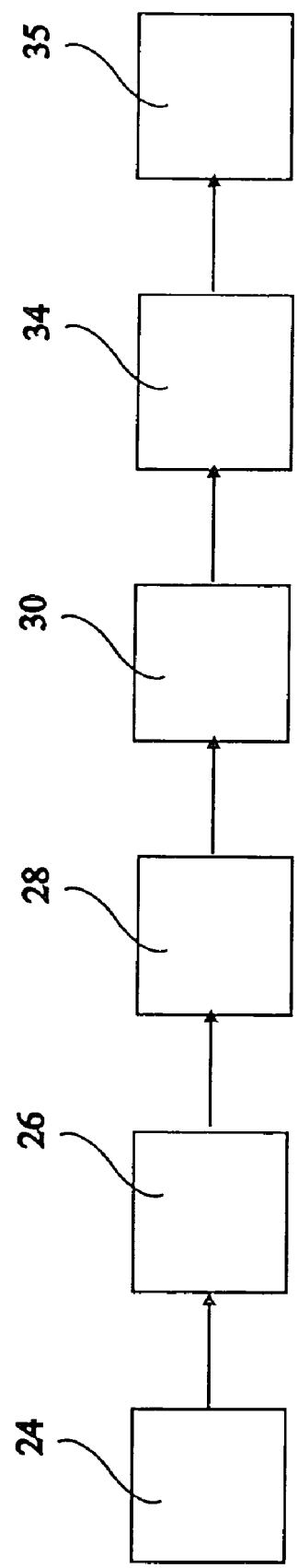
FIG. 2B depicts the inventive dry etching flow process for a compound semiconductor material.
Figure 2C:
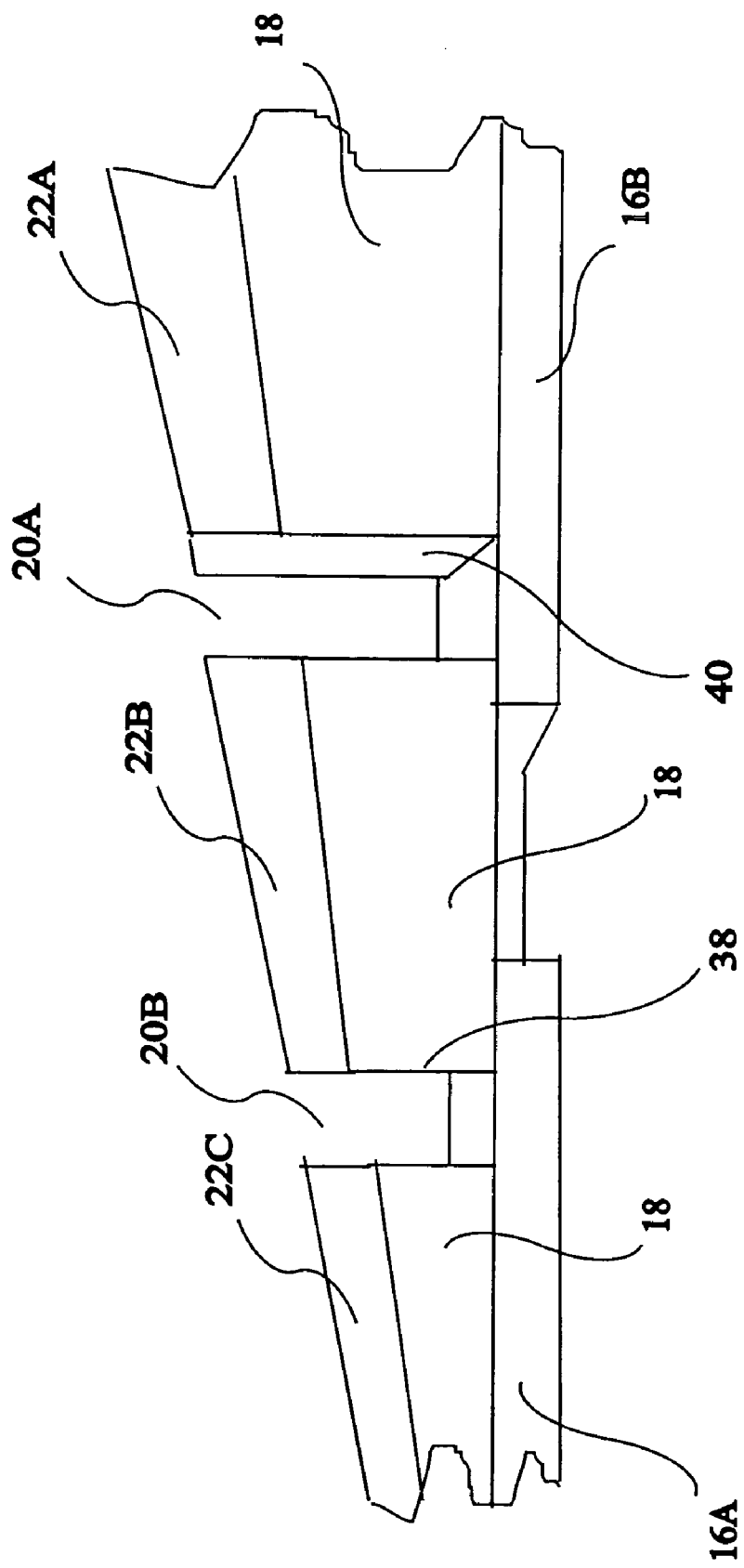
FIG. 2C is a final structure for the dry etching process for a compound semiconductor material.

FIGS. 2A, 2B and 2C illustrate a beginning structure, a process flow, and a final structure disclosing a dry etching process for a compound semiconductor material. In one embodiment, compound semiconductor wafer comprises a compound semiconductor material. More specifically, the dry etching process described below is one that prevents front-side metal layer punch-through even with large thickness variations across the compound semiconductor material.

FIG. 2A depicts the compound semiconductor material that will be etched using the inventive dry etching process. In particular, the inventive dry etching process comprises the step of placing in a chamber (not shown in the Figure) the compound semiconductor material 18 on an electrostatic chuck (not shown in the Figure). Preferably, the chamber is an inductively coupled plasma (ICP) power machine such as a Trikon Omega 201 ICP. The structure in FIG. 2A comprises a compound semiconductor material 18 having exposed portions 20A, 20B. In this step, the compound semiconductor material 18 is selected from a group consisting of Gallium Arsenide (GaAs), Indium Phosphide (InP) and III–V semiconductor compound. Further, at least one portion of compound semiconductor 18 is covered by masks 22A, 22B. In one embodiment, masks 22A, 22B, 22C are photo-resist layers. In the embodiment of this present invention, front-side metal layers 16A, 16B comprise gold (Au). In another embodiment, front-side metal layers 16A, 16B may further comprise titanium, platinum or other materials that allow electrical conductive properties for electrical current flow.

FIG. 2B depicts the inventive dry etch flow process. Afterwards in this embodiment, a halogen etchant 24 selected is a halogen gas. In one alternative embodiment, halogen etchant 24 is a halogen gas selected from a group consisting of Chlorine, Fluorine and Bromine. Further, in another alternative embodiment of the present invention, halogen-containing compound is selected from a group consisting of Hydrogen Bromide (HBr) and Hydrogen Iodide (HI). Following, halogen etchant 24 is released 26 into the chamber (not shown in the Figure). Following nitrogen gas 28 is added to the chamber. Preferably, the volume ratio of halogen etchant 24 to nitrogen gas 28 is greater than 10:1. Furthermore, in an alternate embodiment of the present invention, the volume ratio of halogen etchant 24 to nitrogen gas 28 is selected from a range of approximately 10:1 to approximately 12:1.

Afterwards, applying heating step 30 comprising heating the electrostatic chuck to a temperature selected from the range of approximately 130 degrees C. to approximately 170 degrees C. In this same embodiment, pressurizing step 32 for halogen etchant 24 and nitrogen gas 28 selected from a range of approximately 5 milli-Torr to approximately 20 milli-Torr. Following, applying a bias power 34 and pulse-modulated power 35 to halogen etchant 24 and nitrogen gas 28. Preferably, bias power step comprises applying bias power 34 to the semiconductor material which preferably is a 4 inch radius semiconductor wafer. Preferably, bias power 34 is selected from a range of approximately 20 Watts to approximately 50 Watts. For other semiconductor substrates, applied bias power 34 scales to maintain the above described ratio of Watts to surface area of the semiconductor wafer. Furthermore, pulse-modulated power 35 comprises applying an inductively coupled plasma (ICP) power source to semiconductor material 18 selected from a range of approximately 350 Watts to approximately 750 Watts. Preferably, ICP power source is a Trikon Omega 201 ICP.

FIG. 2C is a final structure resulting from the dry etching process of the present invention. In this Figure, the exposed portion of the compound semiconductor material is etched with vertical sidewalls in the X crystalline direction 38 and Y crystalline direction 40 showing no punch-through of front-side metal layers 16A, 16B.

Figure 3:
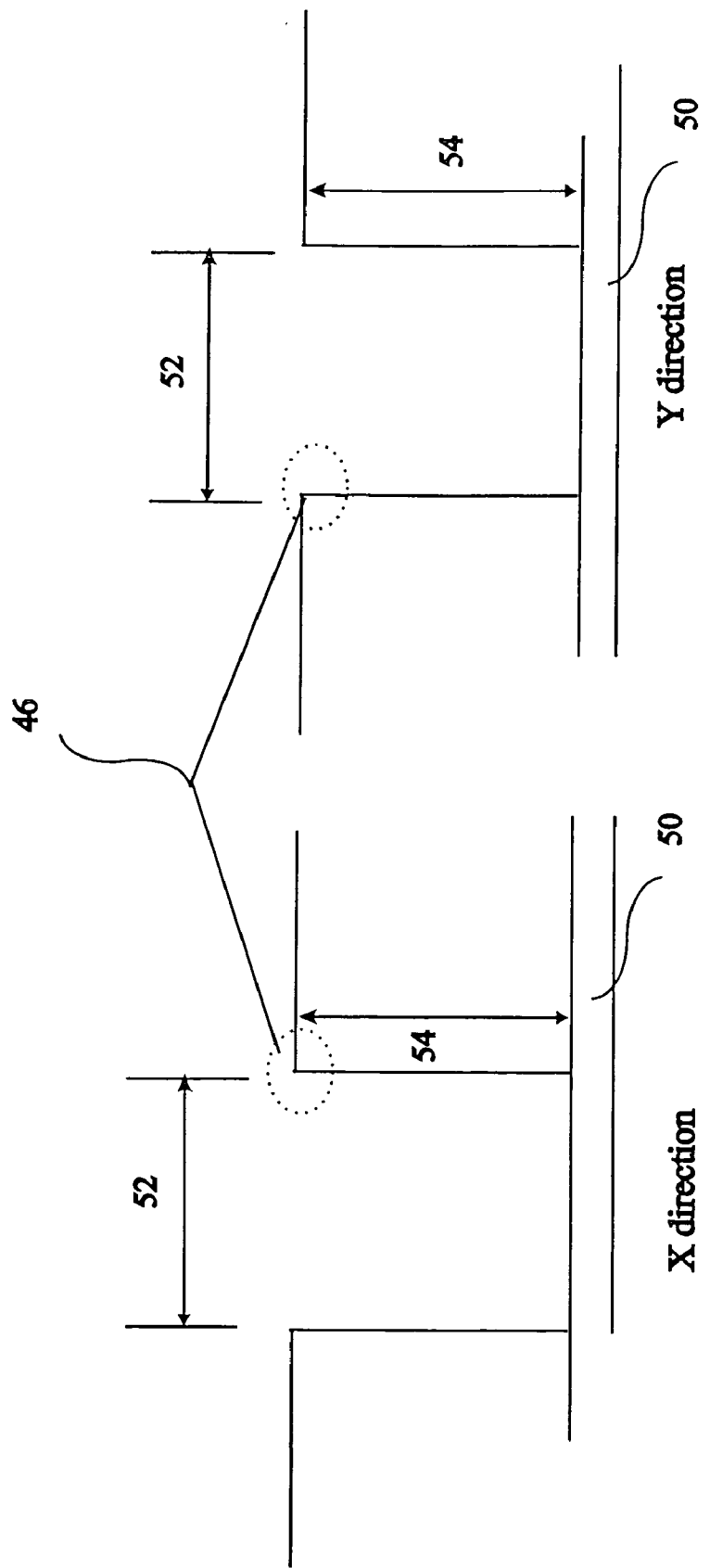

FIG. 3 is an example illustrating the dry etching flow process of FIG. 2 of the present invention of a compound semiconductor wafer. In this FIG. 3 based on a Scanning Electronic Microscope (SEM) photograph, a compound semiconductor material is dry etched using the flow process of FIG. 2B resulting in no undercutting 46 and no punch-through shown on the SEM front-side metal layer 50. As shown, there is no undercutting 46 of SEM via-opening or punch-through of SEM front-side metal layer 50. In this embodiment of the present invention, SEM via hole width 52 may be in a range of approximately 60 microns (μms) to approximately 70 μms. Further, in this same embodiment of the present invention, SEM via hole height 54 may be for the edge of the wafer in a range of approximately 60 μms to approximately 70 μms. In addition, in this same embodiment of the present invention, the SEM via hole height 54 may be for the center of the wafer in a range of approximately 70 μms to approximately 90 μms.

It is an advantage of the present invention that the dry etching process does not damage the non-exposed portion of the compound semiconductor wafer during the etching process. It is an additional advantage of the embodiment of the present invention that the addition of nitrogen gas to halogen etchant 24 reduces the etch rate of a front-side metal layer with a range of approximately 80 percent to approximately 90 percent compared to the etch rate of the compound semiconductor material.

Additionally, the present invention discloses the dry etchant for compound semiconductor material G and F, wherein G is selected from the group consisting of a halogen etchant 24 and F is a nitrogen gas 28, and wherein the volume ratio of G to F is with a range of approximately 10:1 to approximately 12:1. In this same embodiment of the present invention, halogen etchant 24 is a halogen gas selected from a group consisting of Chlorine, Fluorine and Bromine. In the alternative, halogen etchant 24 is a halogen-containing compound selected from a group consisting of Hydrogen Bromide (HBr) and Hydrogen Iodide (HI).

Information as herein shown and described in detail is fully capable of attaining the above-described object of the invention and the present embodiment of the invention, and is, thus, representative of the subject matter which is broadly contemplated by the present invention. The scope of the present invention fully encompasses other embodiments which may become obvious to those skilled in the art, and is to be limited, accordingly, by nothing other than the appended claims, wherein reference to an element in the singular is not intended to mean "one and only one" unless explicitly so stated, but rather "one or more." All structural and functional equivalents to the elements of the above-described embodiment and additional embodiments that are known to those of ordinary skill in the art are hereby expressly incorporated by reference and are intended to be encompassed by the present claims.

Moreover, no requirement exists for a device or method to address each and every problem sought to be resolved by the present invention, for such to be encompassed by the present claims. Furthermore, no element, component, or method step in the present disclosure is intended to be dedicated to the public regardless of whether the element, component, or method step is explicitly recited in the claims. However, one skilled in the art should recognize that various changes and modifications in form and material details may be made without departing from the spirit and scope of the inventiveness as set forth in the appended claims. No claim herein is to be construed under the provisions of 35 U.S.C. § 112, sixth paragraph, unless the element is expressly recited using the phrase "means for."

INDUSTRIAL APPLICABILITY

The present invention applies industrially to dry etching process for semiconductor wafers. More particularly, the present invention applies industrially to a dry etching process that selectively etches a compound semiconductor wafer faster than the front-side metal layer. Even more particularly, the present invention, applies industrially to the dry etching process produces a vertical wall profile.

We claims:

1. A dry etching process for a semiconductor wafer having variable thickness comprising the steps of:
    placing in a chamber said semiconductor wafer having on one side a compound semiconductor material with an exposed portion and on the opposing side a metal layer;
    releasing an halogen etchant into said chamber;
    adding a nitrogen gas to said chamber;
    heating said compound semiconductor material;
    applying pressure to said halogen etchant and said nitrogen gas;
    applying a bias power and a pulse-modulated power to said halogen etchant and said nitrogen gas; and
    continuing the dry etching process until a desired via-hole is selectively etched in the compound semiconductor material to produce vertical sidewalls in X and Y crystalline directions therein without punch-through of the metal layer.

2. A dry etching process as recited in claim 1 wherein said compound semiconductor material has an etch rate that is within a range of approximately 70 times to approximately 80 times faster than said etch rate of a front-side metal layer on said compound semiconductor material.

3. A dry etching process as recited in claim 1, wherein said chamber contains by volume not less than 10 parts halogen etchant to 1 part said nitrogen gas.

4. A dry etching process as recited in claim 3, wherein said halogen etchant is one selected from the group consisting of Chlorine, Fluorine and Bromine.

5. A dry etching process as recited in claim 3, wherein said halogen etchant is one selected from the group consisting of Hydrogen Bromide and Hydrogen Iodide.

6. A dry etching process as recited in claim 1, wherein said halogen etchant is Hydrogen Bromide.

7. A dry etching process as recited in claim 1, wherein said compound semiconductor material is selected from a group consisting of Gallium Arsenide and Indium Phosphide.

8. A dry etching process as recited in claim 1, wherein said volume ratio of said halogen etchant to said nitrogen gas is selected from a range of approximately 10:1 to approximately 13:1.

9. A dry etching process as recited in claim 1, wherein said heating step comprises applying a temperature to said halogen etchant and said nitrogen gas selected from a range of approximately 130 degrees C. to approximately 170 degrees C.

10. A dry etching process as recited in claim 1, wherein applied pressure of said halogen etchant and said nitrogen gas is selected from a range of approximately 5 milli-Torr to approximately 20 milli-Torr.

11. A dry etching process as recited in claim 1, wherein said bias power step comprises introducing a bias power to said semiconductor material selected from a range of approximately 20 Watts to approximately 50 Watts.

12. A dry etching process as recited in claim 1, wherein said pulse-modulated power step comprises applying an inductively coupled plasma power to said compound semiconductor material selected from a range of approximately 350 Watts to approximately 750 Watts.

13. A dry etching process as recited in claim 1, wherein a non-exposed portion of said semiconductor wafer is not damaged during said etching process.

14. A dry etching process as recited in claim 1, wherein said addition of said nitrogen gas to said halogen etchant reduces said etch rate of said front-side metal layer by more than 90 percent.

15. A dry etching process for a semiconductor wafer comprising the steps of:
    placing in a chamber said semiconductor wafer having on one side a compound semiconductor material with an exposed portion and on the opposing side a metal layer;
    releasing a halogen etchant into said chamber;
    adding nitrogen gas to said chamber;
    heating said compound semiconductor material;
    applying a bias power and an inductively coupled plasma power to said halogen etchant and said nitrogen gas; and
    continuing the dry etching process until the desired via-hole is selectively etched in the compound semiconductor material;
thereby producing vertical sidewalls in X and Y crystalline directions for a compound semiconductor material having a variable thickness without punch-through of the metal layer.

16. The method of claim 15 wherein said dry etch process has an etch rate within a range of approximately 70 times to approximately 80 times faster than said etch rate of a front-side metal layer disposed on said compound semiconductor material.

17. The method of claim 15 wherein said halogen etchant to said nitrogen gas volume ratio is selected from a range of approximately 10:1 to approximately 12:1.

* * * * *